US010924098B2

(12) United States Patent
Turnquist et al.

(10) Patent No.: US 10,924,098 B2
(45) Date of Patent: Feb. 16, 2021

(54) SEQUENTIAL CIRCUIT WITH TIMING EVENT DETECTION AND A METHOD OF DETECTING TIMING EVENTS

(71) Applicant: MINIMA PROCESSOR OY, Oulu (FI)

(72) Inventors: Matthew Turnquist, Salo (FI); Ari Paasio, Littoinen (FI)

(73) Assignee: MINIMA PROCESSOR OY, Oulu (FI)

(*) Notice: Subject to any disclaimer, the term of this patent is extended or adjusted under 35 U.S.C. 154(b) by 0 days.

(21) Appl. No.: 16/606,196

(22) PCT Filed: Apr. 18, 2017

(86) PCT No.: PCT/FI2017/050290
§ 371 (c)(1),
(2) Date: Oct. 17, 2019

(87) PCT Pub. No.: WO2018/193150
PCT Pub. Date: Oct. 25, 2018

(65) Prior Publication Data
US 2020/0099372 A1 Mar. 26, 2020

(51) Int. Cl.
H03K 5/1534 (2006.01)
H03K 3/0233 (2006.01)
H03K 3/037 (2006.01)
H03K 19/003 (2006.01)

(52) U.S. Cl.
CPC ....... *H03K 5/1534* (2013.01); *H03K 3/02335* (2013.01); *H03K 3/037* (2013.01); *H03K 19/003* (2013.01)

(58) Field of Classification Search
CPC .. H03K 3/02335; H03K 3/037; H03K 5/1534; H03K 19/003
See application file for complete search history.

(56) References Cited

U.S. PATENT DOCUMENTS 6,108,794 A * 8/2000 Erickson ............ G01R 31/3016
713/401
8,185,812 B2 * 5/2012 Das ........................ G06F 11/167
714/814

(Continued)

FOREIGN PATENT DOCUMENTS

WO 2012007643 A1 1/2012

OTHER PUBLICATIONS

Bowman, K. A. et al. Energy-Efficient and Metastability-Immune Resilient Circuits for Dynamic Variation Tolerance. In: IEEE Journal of Solid-State Circuits Jan. 2009, vol. 44, No. 1, pp. 49-63, <D01:10.1109/JSSC.2008.2007148> figures 2-3.

(Continued)

*Primary Examiner* — Patrick O Neill
(74) *Attorney, Agent, or Firm* — Brooks Kushman P.C.

(57) ABSTRACT

A sequential circuit with timing event detection is disclosed. The sequential circuit has an input that is asserted to the output during the second clock phase of a two phase clock signal. A timing event detector is coupled to the sequential element input to assert a timing event signal if a transition occurs at the sequential element input during the second clock phase but not to assert during the first clock phase.

4 Claims, 6 Drawing Sheets

(56) References Cited

U.S. PATENT DOCUMENTS

| | | | | |
|---|---|---|---|---|
| 8,301,970 B2* | 10/2012 | Bowman | .............. | H03K 3/0375 |
| | | | | 714/758 |
| 9,229,051 B2* | 1/2016 | Sharma | .............. | G01R 31/2884 |
| 10,382,027 B2* | 8/2019 | Das | ...................... | H03K 5/1534 |

OTHER PUBLICATIONS

International Search Report for PCT/FI2017/050290 prepared by the Finnish Patent Office, dated Jan. 12, 2018, 3 pages.

* cited by examiner

| (Rising Edge) | D | $V_{C1}$ | $V_{C2}$ | TE | COMPs |
|---|---|---|---|---|---|
| | 0 | 1->0 | 1 | 0 | 1* |
| | 1 | 1 | 1->0 | 0 | 1* |

*After VC1, VC2 settled

550

| (clock high) | D | $V_{C1}$ | $V_{C2}$ | XNOR1 | TE |
|---|---|---|---|---|---|
| | 0->1 | 0 | 1 | 0->1 | 0->1 |
| | 1->0 | 1 | 0 | 0->1 | 0->1 |

560

| (clock low) | D | $V_{C1}$ | $V_{C2}$ | TE |
|---|---|---|---|---|
| | 0 | 1 | 1 | 0 |
| | 1 | 1 | 1 | 0 |

SEQUENTIAL CIRCUIT WITH TIMING EVENT DETECTION AND A METHOD OF DETECTING TIMING EVENTS

CROSS-REFERENCE TO RELATED APPLICATION

This application is the U.S. national phase of PCT Application No. PCT/FI2017/050290 filed on Apr. 18, 2017, the disclosures of which is incorporated in its entirety by reference herein.

BACKGROUND OF THE INVENTION

Field of the Invention

The invention relates generally to controlling energy consumption of electronic devices such as, digital processor circuits. In particular, the invention relates to detecting timing events within an electronic device.

Description of the Related Art

Combinational logic timing constraints within a traditional digital design flow are static since they are determined during logic synthesis. The circuit resulting from the synthesis must meet worst-case operation conditions in order to guarantee circuit operation during run time. In other words, the timing constraints generated during the synthesis must meet worst-case delay conditions. These worst-case timing constraints typically introduce over-design. Over-design leads to an increase in the system's power consumption and area. A traditional digital design flow at or near the threshold voltage requires especially large over-design since the sensitivity to global and local process variations is largest within this voltage region.

Digital design flows equipped with a timing event detection system remove the need for worst-case design constraints. A timing event detection system is able to tolerate late arriving data from the combinational logic. Timing event detector (TED) circuits within the timing event detection system enable the system to tolerate late arriving data and react to recover from the event.

Figure 1A:
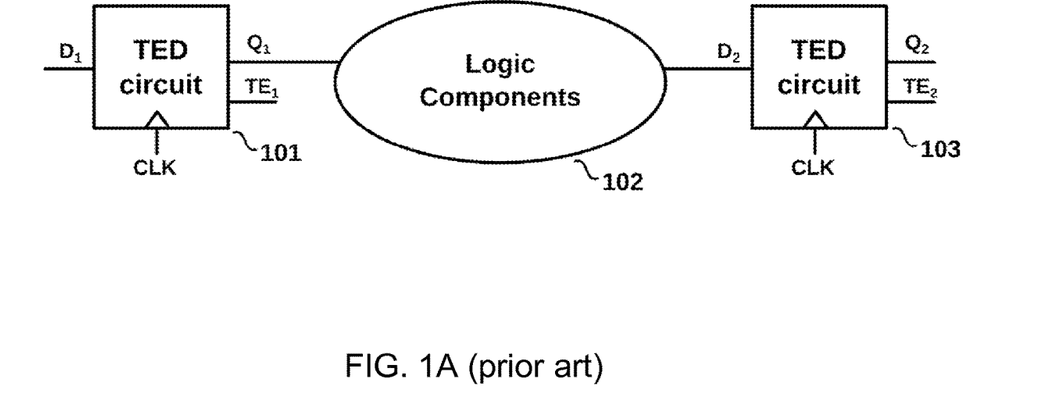
FIG. 1A is a diagram illustrating a prior art logic stage between two TED circuits.
Figure 1B:
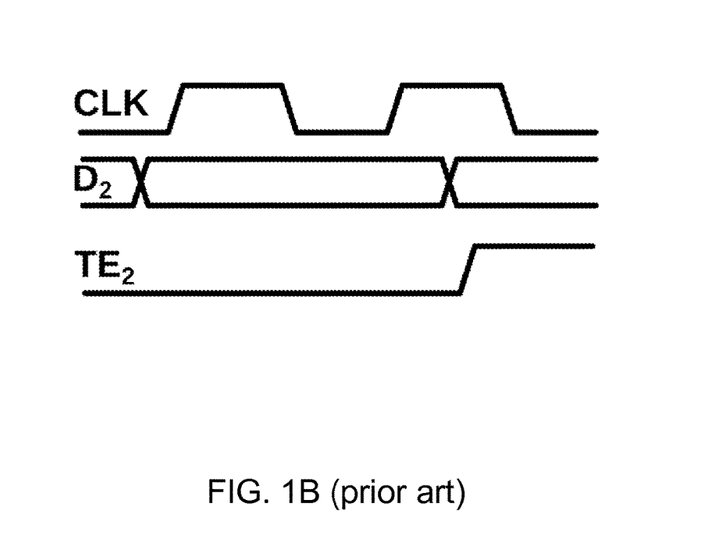
FIG. 1B is a timing diagram illustrating the concept of timing event detection.

Examples of TED operation are shown conceptually in FIGS. 1A and 1B. A logic stage 102 between two TED circuits 101, 103 (with input data signals $D_1$, $D_2$, timing event signals $TE_1$, $TE_2$, and output signals $Q_1$, $Q_2$, respectively) is shown in FIG. 1A. The signals of the second TED circuit 103 are shown in FIG. 1B. As can be seen from FIG. 1B, the first transition in data $D_2$ arrives early and does not trigger a timing event signal $TE_2$, whereas the second transition in $D_2$ arrives late and triggers a $TE_2$ signal. The timing event signal $TE_2$ can then be used to trigger an instruction replay in modern processors or extend the period of a clock signal CLK, for example.

Figure 2:
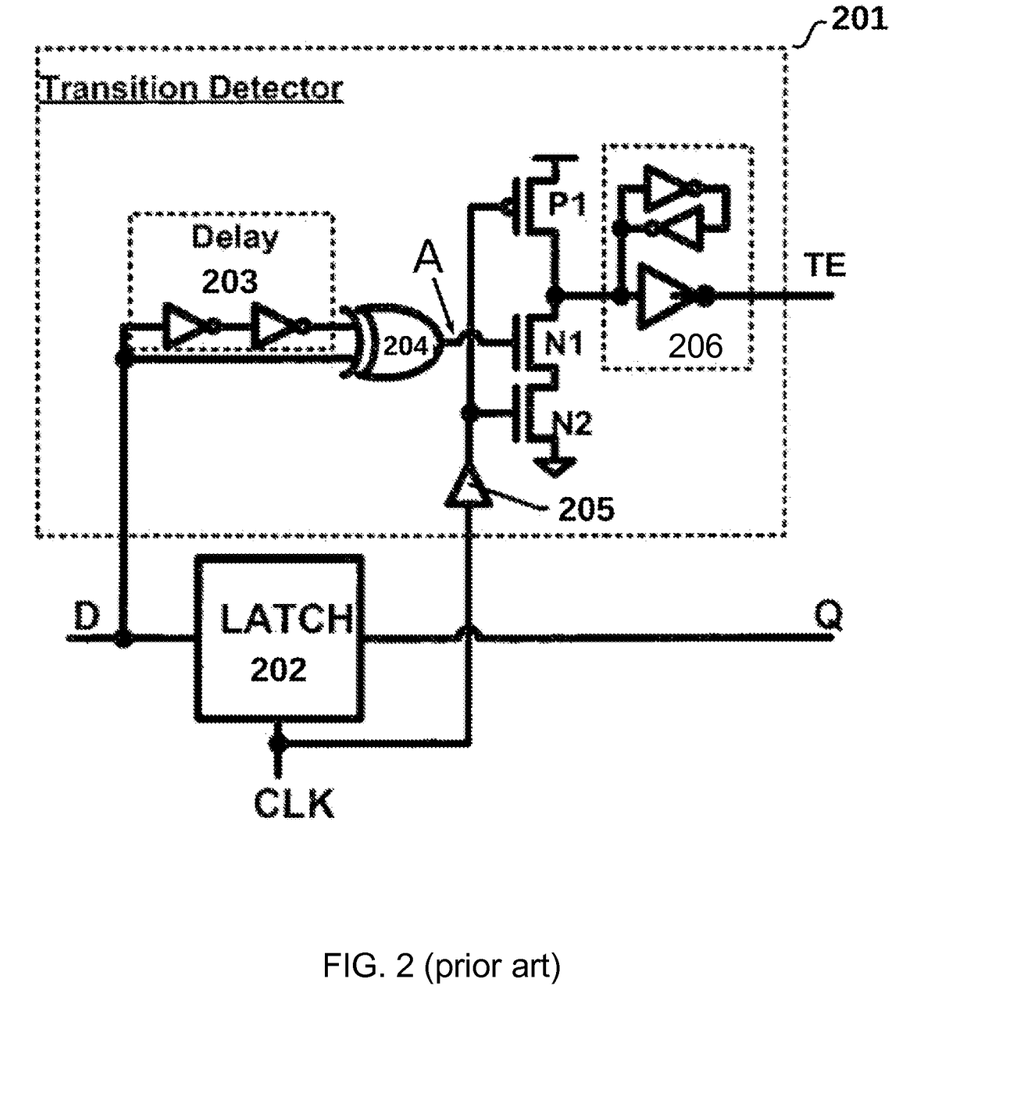
FIG. 2 is a schematic diagram of a prior art timing error detection circuit.

An example of a conventional TED circuit for timing event detection is shown in FIG. 2. Here, the data D and clock CLK inputs of a conventional latch 202 are connected to a transition detector 201 which generates the timing event signal TE when D transitions within the clock high period (for a positive edge triggered latch). The pulse generator, which is formed by the delay line 203 and the XOR (exclusive OR) gate 204, generates a pulse signal A when D transitions from low-to-high or high-to-low. The pulse signal A drives the dynamic logic gate (comprising PMOS (p-channel metal-oxide semiconductor) transistor P1 and NMOS (n-channel metal-oxide semiconductor) transistors N1, N2, with driver 205 providing delay)—acting as input node to keeper circuit 206)—to ground, and consequently, generates a timing event signal (i.e. TE transitions low-to-high).

Conventional TED circuits typically have low reliability and are costly in terms of area when operated at low supply voltages (e.g. at or near the threshold) and/or in modern deep sub-micron complementary metal-oxide-semiconductor (CMOS) circuits. For example, dynamic logic gates are highly susceptible to noise and leakage currents even with additional area overhead. Another disadvantage of conventional TED circuits is the requirement for a pulse signal A. Furthermore, generation of the pulse signal A is costly in terms of area because the pulse signal A is highly susceptible to the effects of local variations on the delay line 203. To ensure that the pulse signal A is wide enough to generate a TE under variations, a large area is required in the delay line 203. Yet, if A is too wide, the performance of the system is limited, i.e. operation speed is reduced.

Accordingly, a new approach is needed that does not require a pulse generator, delay chains, or dynamic logic gates.

SUMMARY OF THE INVENTION

An embodiment of a sequential circuit comprises a sequential element having an input signal that is asserted to an output during a second clock phase of a two-phase clock signal. The sequential circuit further comprises a timing event detector that is coupled to the input signal of the sequential element. The timing event detector is configured to assert an event signal in response to a transition occurring at the input signal of the sequential element during the second clock phase. The timing event detector is further configured to refrain from asserting the event signal during a first clock phase of the two-phase clock signal.

Herein, the term "clock phase" refers to a duty cycle part of a clock signal. Thus, the first clock phase refers to a first duty cycle part of the clock signal, and the second clock phase refers to a second duty cycle part of the clock signal.

In an embodiment, alternatively or in addition to the above described embodiments, the timing event detector comprises a clocked comparator configured to set the differential value of input data at a clock edge.

In an embodiment, alternatively or in addition to the above described embodiments, the timing event detector further comprises a digital logic block, and the clocked comparator is further configured to set the digital logic block in order to allow timing event detection.

An embodiment of a method of detecting timing events comprises:

determining whether a clock signal is transitioning from a first clock phase to a second clock phase;

in response to the clock signal determined to be transitioned from the first clock phase to the second clock phase:

setting a differential state of a clocked comparator based on input data;

setting feedback from a digital logic block to the clocked comparator to allow the differential state of the clocked comparator to be saved when the clock signal transitions from the first clock phase to the second clock phase;

determining whether the clock signal is in the second clock phase;

in response to the clock signal determined to be in the second clock phase:

determining whether a data signal is transitioning from a first state to a second state or from the second state to the first state while the clock signal is in its second clock phase;

in response to the clock signal determined to be transitioned from the first state to the second state or from the second state to the first state while the clock signal is in its second clock phase:

flagging a timing event.

In an embodiment, the first clock phase of the clock signal corresponds to low and the second clock phase of the clock signal corresponds to high, and the first state of the data signal corresponds to low and the second state of the clock signal corresponds to high. In another embodiment, the first clock phase of the clock signal corresponds to high and the second clock phase of the clock signal corresponds to low, and the first state of the data signal corresponds to high and the second state of the data signal corresponds to low.

The invention allows detecting timing events within a digital logic block without requiring delay chains, pulse generators or traditional latches. Accordingly, the invention allows reduced design time, enhanced robustness in timing event detection, and enhanced applicability to low supply voltage implementations and deep sub-micron CMOS implementations.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings:

FIG. 5B is a timing diagram of the sequential logic element with timing event detection of FIG. 5a.

Like reference numerals are used to designate like parts in the accompanying drawings.

DETAILED DESCRIPTION OF THE INVENTION

Reference will now be made in detail to embodiments of the present invention, examples of which are illustrated in the accompanying drawings. The detailed description provided below in connection with the appended drawings is intended as a description of the present examples and is not intended to represent the only forms in which the present examples may be constructed or utilized. The description sets forth the functions of the examples and the sequence of steps for constructing and operating the examples. However, the same or equivalent functions and sequences may be accomplished by different examples.

Figure 3:
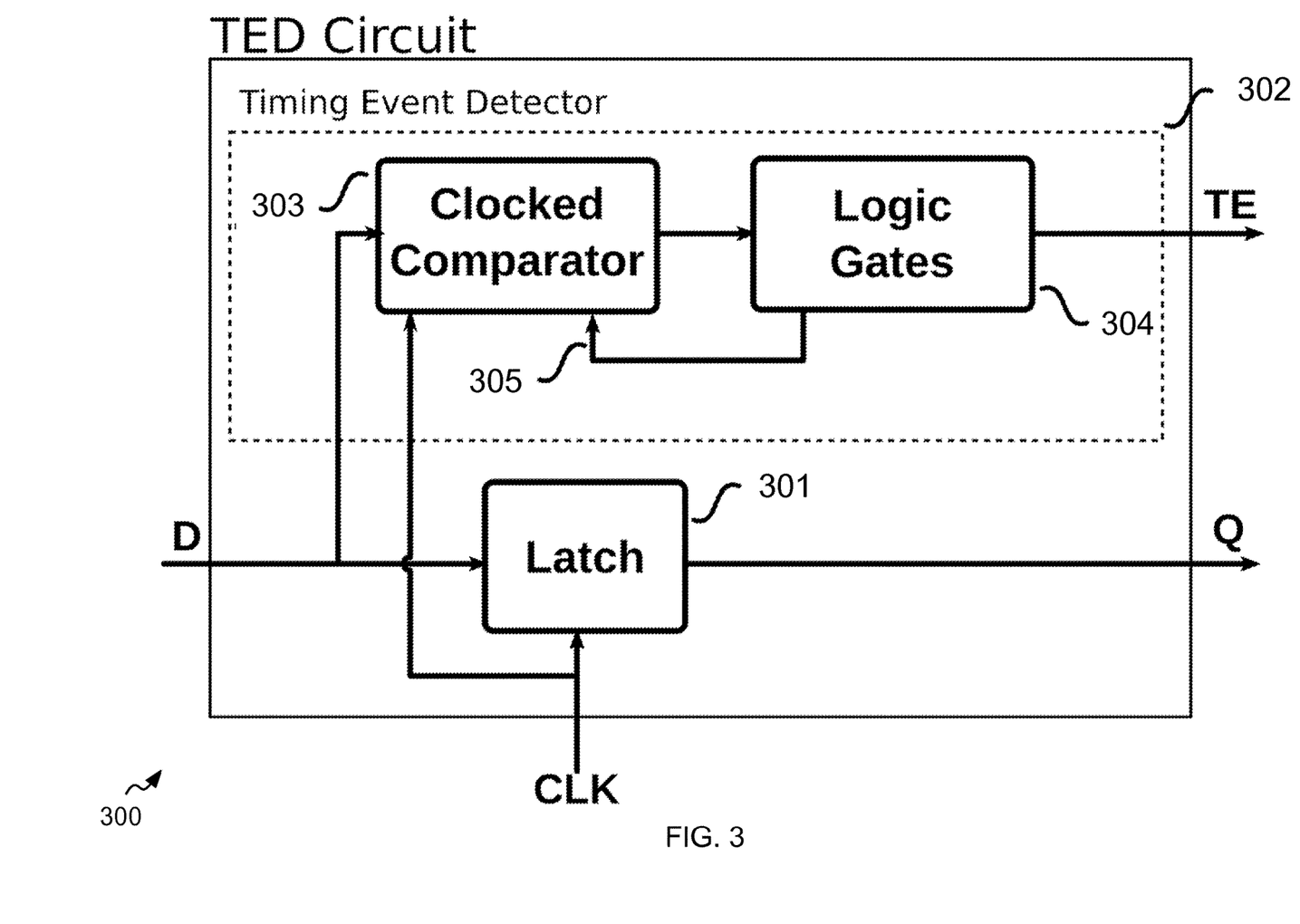
FIG. 3 is a schematic diagram of a sequential logic element with timing event detection in accordance with an example embodiment.

FIG. 3A illustrates a sequential logic element 300 with timing event detection in accordance with an example embodiment. This circuit 300 can be used e.g. to replace traditional master-slave flip-flop and/or latch-based circuits in critical paths of pipelined logic. The sequential logic element 300 of FIG. 3 comprises a data latch 301 and a timing event detector 302. The timing event detector 302 may be used e.g. to improve performance, improve yield, and reduce power consumption.

The timing event detector 302 comprises a clocked comparator 303 and logic gates 304. The differential state of the clocked comparator 303 is set based on the value of the input data D when CLK transitions from low-to-high (LH). Logic gates 304 monitor the differential state of the clocked comparator 303. After CLK rises from LH, and the differential state of the clocked comparator has reached steady-state, the logic gates 304 apply a logic high on the feedback path 305 in order to maintain the differential state of the clocked comparator 303 until the CLK transitions high-to-low (HL). When CLK is high, any transitions of D from LH or HL trigger a timing event (TE).

The timing event detector 302 removes the prior art need for a pulse generator, delay chains, or dynamic logic gates. Thus, the timing event detector 302 is advantageous e.g. in modern deep sub-micron CMOS circuits and at low supply voltages.

Figure 4:
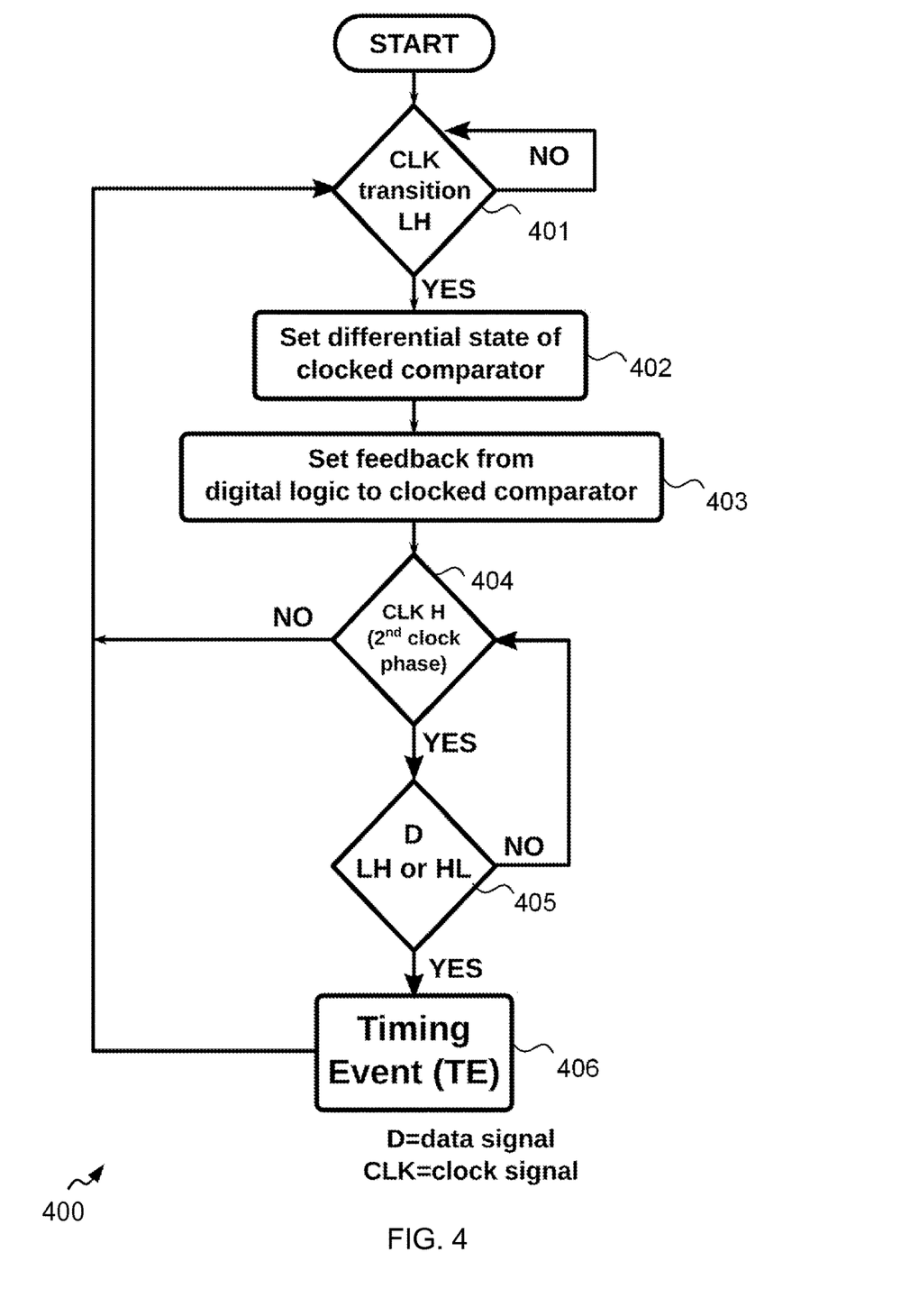
FIG. 4 is an example flow diagram of the sequential logic element with timing event detection of FIG. 3A.

FIG. 4 is an example flow diagram of a method 400 of detecting timing events. In the method 400 illustrated in FIG. 4, timing events are only detected when the clock signal CLK is high. Although it is not shown, the system can be designed to generate timing events only when CLK is low by adding an inverter to the CLK inputs of the latch 301 and the timing event detector 302 of FIG. 3.

At operation 401, it is determined whether the clock signal CLK transitions from low-to-high. If yes, the method proceeds to operation 402. Otherwise, the method stays at operation 401.

At operation 402, the differential state of the clocked comparator is set using the data signal D, an inverted version of D, and the clock signal CLK.

At operation 403, feedback from a block of digital logic gates to the clocked comparator is set in order to ensure that further changes in the input data D do not change the differential state of the clocked comparator.

At operation 404, it is determined whether the clock signal CLK is high. If yes, the method proceeds to operation 405. Otherwise, the method returns to operation 401.

At operation 405, it is determined whether the data signal D transitions from LH or HL when CLK is high. If yes, the method proceeds to operation 406. Otherwise, the method returns to operation 404.

At operation 406, a timing event is flagged in response to determining that D transitioned from LH or HL during the time CLK was high, i.e. in response to determining that D switched to a state which differs from the state recorded at operation 406. Finally, the method may return to operation 401.

Figure 5A:
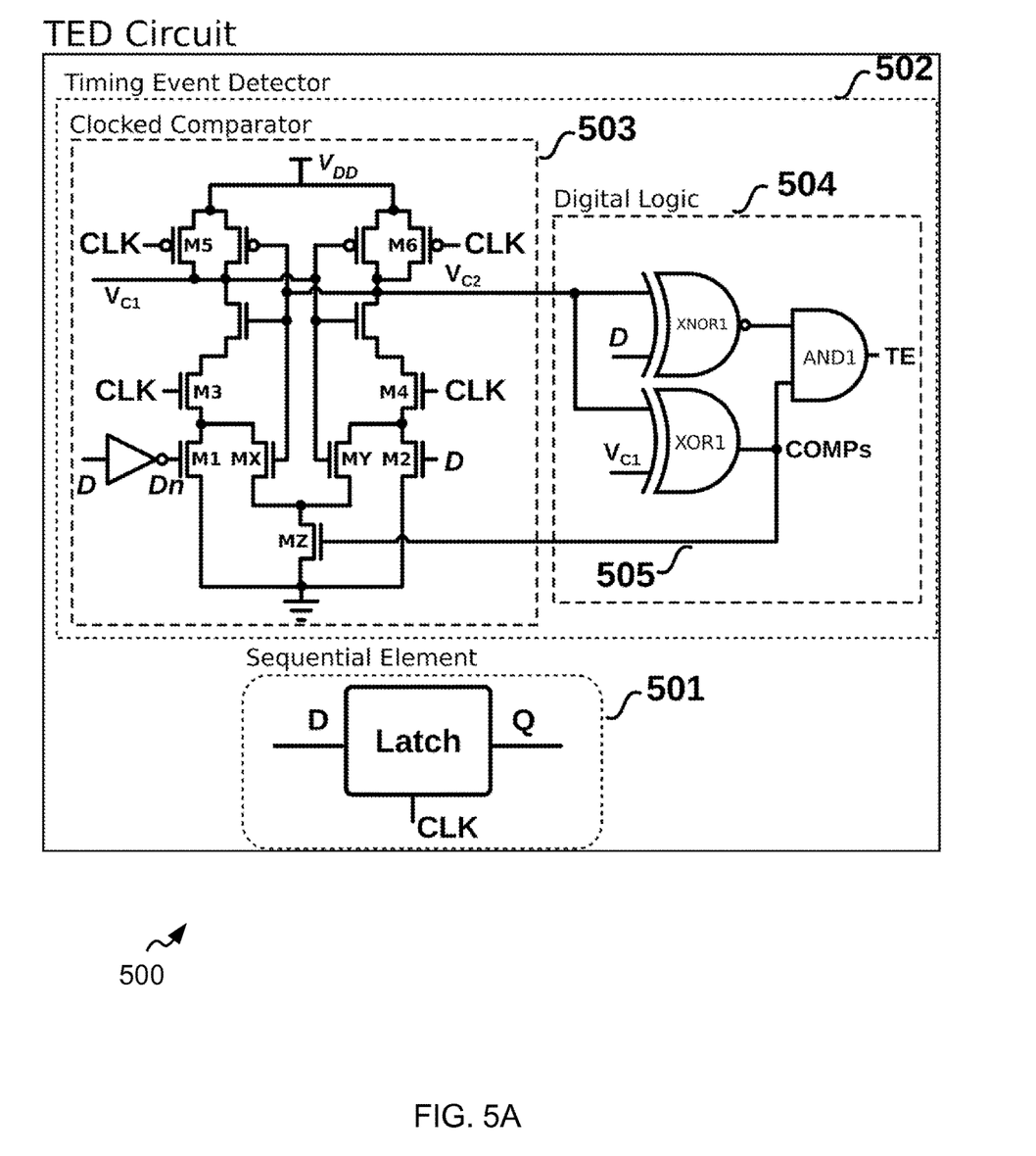
FIG. 5A is a schematic diagram of a sequential logic element with timing event detection in accordance with an example embodiment.

FIG. 5A is another schematic diagram of a sequential logic element 500 with timing event detection in accordance with an example embodiment. The sequential logic element 500 of FIG. 5A comprises a timing event detector 502 and a sequential element 501. The timing event detector 502 comprises a clocked comparator 503 and a digital logic block 504. The digital logic block 504 monitors the differential state of the clocked comparator 503 and the input data D, and when necessary, triggers a timing event TE. A timing event is triggered (i.e. TE transitions from low-to-high) when D transitions from LH or HL when CLK is high.

The differential state of the clocked comparator 503 is determined from the value of the input data D when CLK transitions from LH. When CLK is low, the clocked comparator 503 is inactive and unable to change its differential state since NMOS transistors M3 and M4 are OFF and PMOS transistors M5 and M6 drive both outputs $V_{C1}$ and $V_{C2}$ of the clocked comparator 503 to a logic high. An inverted version of the input data signal D (here designated with Dn) assists the operation of the differential structure within the clocked comparator 503. When CLK transitions from LH, inputs D and Dn determine the outputs $V_{C1}$ and $V_{C2}$. If, for example, D is high and thus Dn is low, as CLK rises from LH $V_{C2}$ is driven to a logic low (0 V) and $V_{C1}$ is driven to a logic high (positive supply voltage, $V_{DD}$). The pull-down network formed by NMOS transistors MX, MY, and MZ within the clocked comparator 503 is not active when CLK rises from LH. The pull-down network (MX, MY, and MZ) is active only after outputs $V_{C1}$ and $V_{C2}$ reach steady-state.

The logic gate XOR1 within the digital logic gate block 504 monitors $V_{C1}$ and $V_{C2}$ within the clocked comparator 503. After CLK rises from LH and the differential outputs $V_{C1}$ and $V_{C2}$ of the clocked comparator reach steady-state, XOR1 triggers a logic high on node COMPs. A logic high on node COMPs is applied as feedback 505 in order to activate the pull-down network (MX, MY, and MZ) within the clocked comparator 503. The activation of the pull-down network due to COMPs transitioning from low-to-high ensures that the states of $V_{C1}$ and $V_{C2}$ are independent of the value of D during the time CLK is high. The pull-down strengths of MX, MY, and MZ are larger than those of transistors M2 and M1 to guarantee that the states of $V_{C1}$ and $V_{C2}$ are not affected by the transitions of D during the time CLK is high.

Once node COMPs is high, the clocked comparator 503 is unable to change the state of $V_{C1}$ and $V_{C2}$ during the time CLK is high. $V_{C2}$ is the logical complement of the value of D at the rising CLK edge. Thus, if D transitions from LH or HL during the time CLK is high, logic gate XNOR1 transitions from LH. Since COMPs is high, logic gate AND1 outputs a logic high and a timing event is flagged, i.e. the timing event TE node goes from low-to-high. In all other conditions, TE is low.

Alternative implementations of the clocked comparator 503 and the digital logic 504 provide the same functionality. For example, the clocked comparator 503 may use one less transistor to be activated at the rising clock edge. In an embodiment, transistors M3 and M4 could be removed and replaced with a single transistor (with a CLK input signal). The single transistor with the CLK input signal could be added between ground and a new node which connects the source of transistors M1 and M2.

The digital logic 504 may also be altered and still produce the same functionality. For example, logic gate XNOR1 may be replaced by a two-input multiplexer (MUX). The output of the MUX may be fed to the two-input logic gate AND1. The control signal to the MUX may be $V_{C1}$, the zero-input to the MUX may be D, and the one-input may be Dn. $V_{C1}$ is logically equivalent to D after the output of the clocked comparator 503 has settled (i.e. COMPs triggered high) following a transition of CLK from low-to-high. If, for example, D is high when CLK transitions from low-to-high, $V_{C1}$ is high while CLK is high. Thus, $V_{C1}$ passes the one-input of the MUX, or Dn. If during the time CLK is high, D does not transition, Dn remains low and the output of the MUX is low. If during the time CLK is high, D transitions from high-to-low, Dn transitions from low-to-high, and the MUX outputs a high. Consequently, logic gate AND1 triggers a timing event (TE) since both of its inputs are high.

Figure 5B:
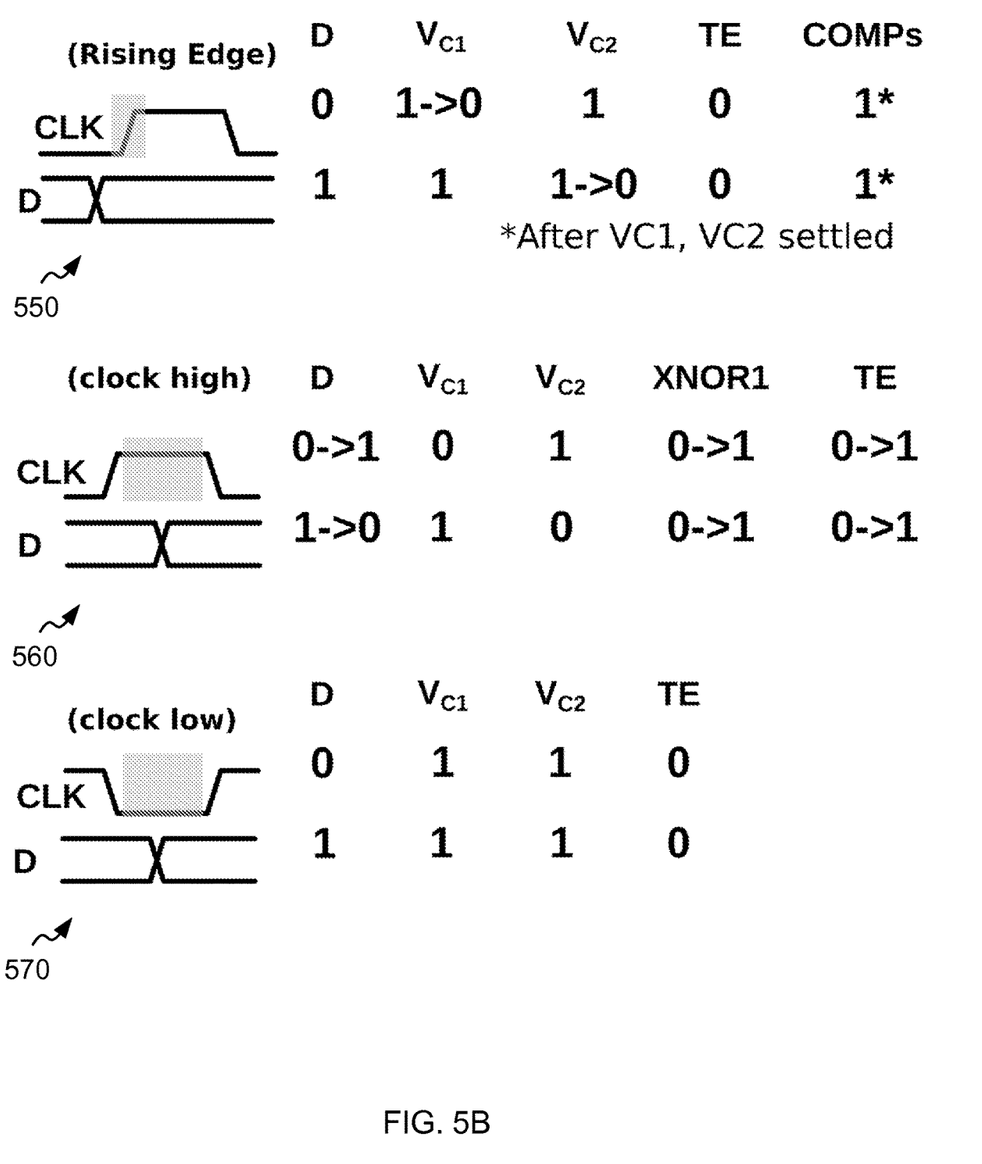

FIG. 5B is a timing diagram further detailing the operation of the circuit of FIG. 5A according to an example embodiment. As shown in diagram 550, at the rising edge (highlighted portion) of the clock signal CLK, either $V_{C1}$ or $V_{C2}$ is driven low depending on the value of the input data signal D. Consequently, the node COMPs is driven high once $V_{C1}$ and $V_{C2}$ settle. As shown in diagram 560, when the clock signal CLK is high (highlighted portion), any transitions of the input data signal D cause logic gate XNOR1 to transition from low-to-high. Since the node COMPs is already set high (i.e. after rising CLK edge), the logic gate AND1 has two high signals. Thus, the timing event node TE node transitions from low-to-high. Herein, this is referred to as timing event detection. As shown in diagram 570, when the clock signal CLK is low (highlighted portion), $V_{C1}$ and $V_{C2}$ are both high, and thus COMPs low. Thus, transitions of the input data signal D from low-to-high or high-to-low do not cause logic gate AND1 to transition from low-to-high (i.e. no timing-events are flagged).

It is to be understood that although the latches 301, 501 of the above discussed embodiments are positive edge triggered latches, any type of latch (for example negative edge triggered) can be used without any loss of generality.

The functionality described herein can be performed, at least in part, by one or more hardware logic components.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

While the present inventions have been described in connection with a number of exemplary embodiments, and implementations, the present inventions are not so limited, but rather cover various modifications, and equivalent arrangements, which fall within the purview of prospective claims.

The invention claimed is:

1. A sequential circuit comprising:

a sequential element having an input signal that is asserted to an output during a second clock phase of a two-phase clock signal; and a timing event detector coupled to the input signal of the sequential element, the timing event detector configured to assert an event signal in response to a transition occurring at the input signal of the sequential element during the second clock phase of the two-phase clock signal and further configured to refrain from asserting the event signal during a first clock phase of the two-phase clock signal, wherein the timing event detector comprises a clocked comparator configured to set its output based on a differential of the value of the input signal and the inverse value of the input signal at a clock edge, and wherein the timing event detector further comprises a digital logic block, and the clocked comparator is further configured to make the output available to the digital logic block in order to allow timing event detection.

2. The sequential circuit according to claim 1, comprising a feedback path from the digital logic block so the clocked comparator for using feedback from the digital logic block to maintain the state of the clocked comparator for the duration of the second clock phase.

3. A method of detecting timing events, the method comprising:

making an output of a clocked comparator available to a digital logic block in order to allow timing event detection, in response to a clock signal transitioning from a first clock phase to a second clock phase:

setting the output of said clocked comparator based on a differential signal consisting of the value of input data and the in-verse value of the input data;

determining whether the input data is transitioning from a first state to a second state or from the second state to the first state while the clock signal is in its second clock phase; and in response to the input data transitioning from the first state to the second state or from the second state to the first state while the clock signal is in its second clock phase:

flagging a timing event.

4. The method according to claim 3, comprising using feedback from said digital logic block to maintain the state of the clocked comparator for the duration of said second clock phase.

* * * * *